United States Patent [19]

Brodsky et al.

[11] Patent Number: 4,757,361
[45] Date of Patent: Jul. 12, 1988

[54] AMORPHOUS THIN FILM TRANSISTOR DEVICE

[75] Inventors: Marc H. Brodsky, Mount Kisco; Frank F. Fang, Yorktown Heights, both of N.Y.

[73] Assignee: International Business Machines Corporation, Armonk, N.Y.

[21] Appl. No.: 889,137

[22] Filed: Jul. 23, 1986

[51] Int. Cl.[4] .................... H01L 27/12; H01L 29/04; H01L 29/78

[52] U.S. Cl. ...................... 357/23.7; 357/2; 357/4; 357/23.4; 357/42; 357/59

[58] Field of Search .................. 357/59 E, 2, 4, 23.7, 357/42, 23.4

[56] References Cited

U.S. PATENT DOCUMENTS

| | | | |
|---|---|---|---|
| 4,422,090 | 12/1983 | Shepherd et al. | 357/23 |
| 4,514,253 | 4/1985 | Minezaki | 156/659.1 |
| 4,547,789 | 10/1985 | Cannella | 357/4 |
| 4,554,570 | 11/1985 | Jastrzebski et al. | 357/23.4 |
| 4,554,572 | 11/1985 | Chatterjee | 357/42 |
| 4,566,025 | 1/1986 | Jastrzebski et al. | 357/42 |

FOREIGN PATENT DOCUMENTS

| | | | |
|---|---|---|---|
| 53-142189 | 12/1978 | Japan | 357/23.4 |
| 57-90977 | 6/1982 | Japan | |
| 60-111456 | 6/1985 | Japan | 357/23.4 |

OTHER PUBLICATIONS

Sze, "Physics of Semiconductor Devices", 2nd ed., Wiley & Sons, N.Y. 1982, pp. 291, 304–307.
Electron Device Letters, vol. EDL-5, No. 4, Apr. 1984, p. 105, "Proposed Vertical-Type Amorphous-Silicon Field-Effect Transistors", by Uchida et al.
Materials Research Society, Spring '85 Meeting, "Short Channel Amorphous Silicon MOS Structures with Reduced Capacitance." by Yaniv et al., Paper F3.6.
IBM Technical Disclosure Bulletin, vol. 29, No. 1, Jun. 1986, p. 343, "Short Channel FET Fabrication," by M. H. Brodsky.
IBM Technical Disclosure Bulletin, vol. 29, No. 5, Oct. 1986, p. 2224, "Thin Film Field Effect Transistor," by Bumble et al.

Primary Examiner—Andrew J. James
Assistant Examiner—Jerome Jackson
Attorney, Agent, or Firm—Alvin J. Riddles

[57] ABSTRACT

A thin film transistor technology where a gate member on a substrate surface is in electric field influenceable proximity to active semiconductor devices in the direction normal to the substrate surface and the ohmic electrodes of the active device are parallel with the substrate surface. The gate is formed on the substrate and conformal coatings of insulator and semiconductor are provided over it. A metal is deposited from the direction normal to the surface that is thicker in the horizontal dimension than the vertical so as to be susceptible to an erosion operation such as a dip etch which separates the metal into self-aligned contact areas on each side of a semiconductor device channel without additional masking. Self-alignment of the source, drain and gate can be achieved by insulator additions above and under the gate fabricated without additional masking.

7 Claims, 3 Drawing Sheets

AMORPHOUS THIN FILM TRANSISTOR DEVICE

DESCRIPTION

1. Technical Field

The field of the invention is in transistors where the semiconductor member is an amorphous layer usually of hydrogenated or fluorinated silicon although crystalline films of silicon or group II-VI compound semiconductors are currently receiving study. Such devices have come to be known in the art as thin film transistors.

Thin film transistor devices have the advantages of economy and compatibility with large area deposition type fabrication technology. The thin film transistor has a structure similar to a conventional field effect transistor in that there are source and drain ohmic electrodes separated by a channel and conduction in the channel, which in the thin film transistor is amorphous, is under the control of a signal applied through a gate electrode in electric field influencing proximity to the channel.

As the specifications for thin film transistor devices become more stringent, shorter channels and reduced series resistance take on greater importance.

2. Background Art

The general technology of thin film transistors has been to provide an array of gate metal elements on a substrate and then to cover the gates first with an insulation layer and then with amorphous silicon up and over each gate metal element and positioning source and drain electrodes on top of the amorphos silicon.

Such structures are shown in U.S. Pat. Nos. 4,422,090 and 4,514,253.

As the art has developed, high performance and low power configurations of these devices is achieved by interconnecting complementary, n channel and p channel devices together in one structure as is shown in U.S. Pat. No. 4,554,572 wherein on a monocrystalline n channel device a thin film transistor p channel structure is positioned with two p channel elements in series along the sides of the gate with source and drain electrodes being formed by heavy doping and silicide layers.

The shortening of the channel length is addressed in Electron Device Letters, Vol. EDL-5, No. 4, April 1984, p. 105 where the channel length is controlled by the thickness of one layer of a series of layers on a substrate and the gate is on the side.

DISCLOSURE OF THE INVENTION

The invention is thin film transistor technology where a gate electrode in the shape of a prism with essentially vertical sides is positioned on a substrate and covered by a series of layers at least one of which, adjacent to the semiconductor layer, is applied from a direction orthogonal to the substrate surface so that there is a reduced thickness in the direction parallel to the sides of the gate electrode so that an eroding operation in removing the reduced thickness layer exposes the adjacent semiconductor layer automatically without an additional level of lithography.

The layer adjacent the semiconductor layer may be applied by evaporation.

A new thin film transistor structure is produced where one ohmic electrode is on the part of the semiconductor layer that is parallel with the substrate, a second ohmic electrode is above the horizontal part of the gate parallel with the substrate and the channel of the device is the vertical exposed portion of the semiconductor layer.

The invention provides a wide range of structural and functional variations with accompanying advantages. The gate is positioned by standard planar delineation such as photolithography. The vertical sides of the gate, the conformal nature of the insulator and semiconductor layers and the orthogonal deposition and erosion provide self-alignment of other contacts.

The vertical portion of the semiconductor layer provides a short channel which in turn provides faster performance. With the short channel there is a larger "on" current which for a given small "off" current provides larger on-off signal ratios and higher switching speed.

Figure 1:
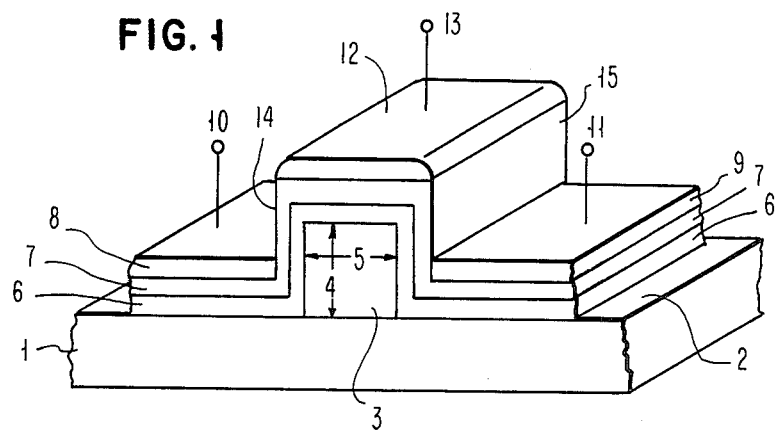
FIG. 1 is a three-dimensional sketch of the structure of the invention.

Referring to FIG. 1, a perspective sketch of the structure of the invention is provided.

In FIG. 1 on a substrate 1 having a planar surface 2, a prism shaped conductive member such as a metal gate 3 is positioned. The gate 3 has a thickness dimension 4, a width dimension 5 and has sidewalls that are essentially perpendicular to the surface 2. One method of achieving essentially perpendicular sidewalls is the standard technique in the art of Reactive Ion Etching. An insulating layer 6 is conformally positioned along the planar surface 2 of the substrate up and over the gate 3 and back along the substrate surface 2. Over the insulator layer 6 there is a conformal deposited semiconductor layer 7.

Electrodes 8 and 9 provide ohmic contact to the semiconductor 7 and in turn are provided with electrical contacts 10 and 11, respectively.

Electrode 12 provides ohmic contact to the semiconductor 7 and has an electrical contact 13. An electrical contact is provided to gate 3.

The portions 14 and 15 of the semiconductor layer 7 serve as the channel portions of thin film transistors, the ohmic electrodes of which are self-aligned with respect to the gate 3. The sketch of FIG. 1 provides two thin film transistors. A first has channel 14, source and drain electrodes 8 and 12 and gate 3. The second has channel 15, source and drain electrodes 9 and 12 and gate 3. The length of the channels 14 and 15 are related to the dimension 4 of the gate 3 in that selection of the dimension 4 and the thickness of the layers establishes the length of the channels in the completed device.

It will be apparent that the structure while illustrated in the example of FIG. 1 as having two transistors with a common gate and one common ohmic source or drain electrode, many variations may readily be made. As examples, the gate 3 in the dimension 5 may be made in separate parts for each future channel when deposited. The gate 3 may have as many sides for channels as sides on the generally prismatic shape of the initial deposited material. Thus, common "fan-in" or multiple "fan-out" circuit configurations are readily achievable.

Figure 2:
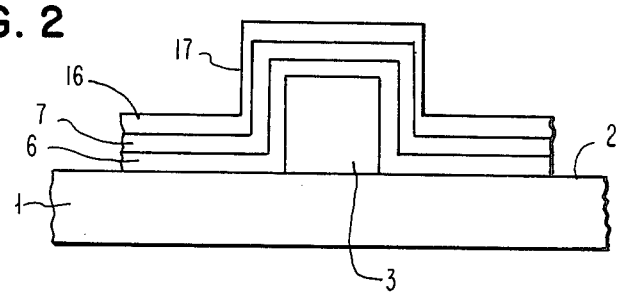
FIGS. 2 and 3 are sketches of orthogonal deposition and erosion manufacturing operations employed in the fabrication of tne invention.
Figure 3:
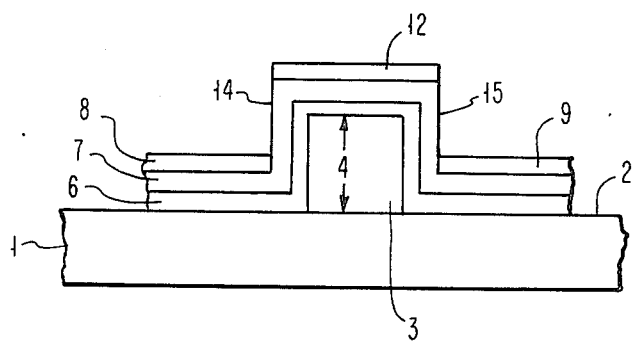

Referring next to FIGS. 2 and 3, the structure is fabricated employing orthogonal deposition and erosion operations.

In FIG. 2 where the same reference numerals are used for the same elements as in FIG. 1, the gate is photolithographically positioned on the substrate 1 and layers 6 and 7 are sequentially and conformally deposited by plasma deposition or metalorganic chemical vapor deposition. The layer 16 adjacent the semiconductor layer 7 is deposited in an operation orthogonal to the surface 2 as shown by the arrows so that there is a thicker deposited layer parallel to the surface 2 than at points 17 along the part of the layer that is vertical with respect to the surface 2. Under some deposition conditions, there may actually be a break in layer 16 at points 17.

An erosion operation, if necessary to break the continuity of layer 16, is then performed where the erosion at points 17 proceeds at the same rate as that of the rest of the layer 16 so that due to the difference in thickness of the layer 16 at points 17, the layer 16 is eroded away. Since layer 16 is adjacent to the semiconductor layer 7, this forms the device channels between the remainders of layer 16 which serve as self-aligned ohmic contacts. The "dip etch" technique, well known in the art, is readily employed for this selective erosion purpose.

In FIG. 3 the channels 14 and 15 are shown exposed as a result of the orthogonal deposition of layer 16 in FIG. 2 or the erosion or etching. The length of the channels 14 and 15 is determined by the thickness of layer 16 and gate 3 as will be shown hereinafter.

In devices of this type it is desirable to align the contact electrodes so as to minimize overlap capacitance with the gate 3. This invention permits self-alignment of the contacts as illustrated in connection with FIGS. 4 and 5.

Figure 4:
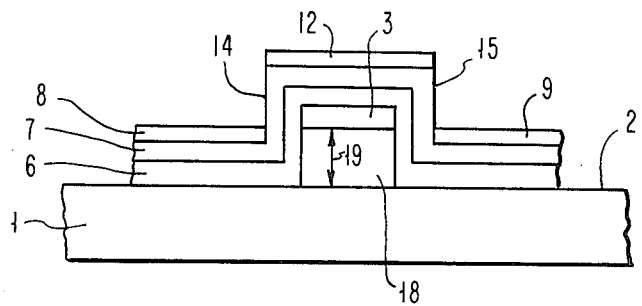
FIGS. 4 and 5 are sketches of self-alignment of the contacts and reduction of parasitic capacitance of the invention.

Referring to FIG. 4 wherein the same reference numerals are used for identical elements an insulating layer 18 is deposited on the surface 2 on which is then deposited the gate 3. The prismatic element is made up of gate 3 on insulating layer 18. The dimension 4 is made up of the thickness of 3 and the thickness 19 of the insulator 18. The thickness dimension 19 of the insulator 18 is chosen to minimize the overlap capacitance between the gate 3 and the electrodes 8 and 9 by being approximately equal to the sum of the thickness of layers 6, 7 and 8 or 6, 7 and 9.

Figure 5:
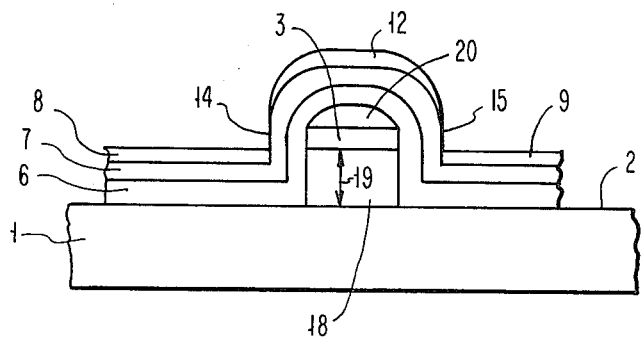

Referring next to FIG. 5 wherein the same reference numerals are used for identical elements, an insulating element 20 is positioned over the gate 3 to reduce capacitance between electrode 12 and the gate 3 by providing additional separation between electrode 12 and gate 3.

This is achieved in accordance with the invention by providing a shape that facilitates bringing the edge of layer 12 to the beginning of the channel.

It will be apparent to one skilled in the art that the technology of the invention will facilitate many structural variations which in turn permit new functional achievements.

As illustrations contact and conductivity limitation conditions may be improved by providing an additional layer on the semiconductor 7, the contact area 12 may be separated into several, each servicing a different device on a vertical side of the gate 3 and the semiconductor layer may be placed outside the contacts.

Considering the first illustration, that of providing a contact semiconductor layer over the switching semiconductor layer.

Figure 6:
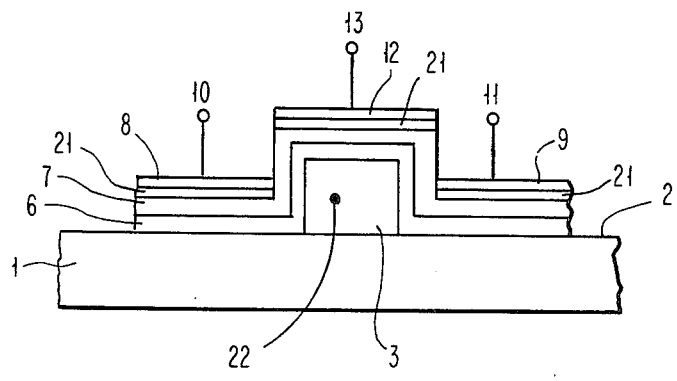
FIGS. 6, 7 and 8 are illustrations of structural variations that produce different semiconductor devices and functional configurations.

Referring next to FIG. 6 wherein the same reference numerals are employed, a second semiconductor layer 21, such as phosphorous doped amorphous silicon, known in the art as n+-a-Si:H is positioned between the semiconductor layer 7 and contacts 8, 9 and 12. The layer 21 may be applied non-conformally and opened on the vertical by erosion or conformally by masking.

The semiconductor layer 21 deposited over the semiconductor layer 7 is heavily doped and the n+ doping provides a lower and uniform electrical resistance contact between the semiconductor 7 and the metal selected for the electrodes 8, 9 and 12. The formation of source and drain contacting metallurgy is provided by orthogonal evaporation and erosion such as dip etching.

Electrical contacts 10, 11, 13 and 22 are then made through contact holes in a protective coating, not shown, to configure the desired circuit.

The resulting structure provides two thin film transistors with a common gate 3 at terminal 22 and a common drain electrode 12 with terminal 13. The source electrodes are 8 with terminal 10 for one transistor and 9 with terminal 11 for the other. Such a structure is useful in such applications as redundancy in driving a pixel in a display and in providing extra current in drivers.

It will be apparent to one skilled in the art that while structures are illustrated with two devices on two sides of an essentially rectangular prism gate 3 electrode, other numbers of devices could be made by adjusting the prism shape to have a single contact 12 for one common connection to the channels and providing more channels by going to a higher sided prism for the gate 3 with separate electrodes for the other ends of the channels.

Figure 7:
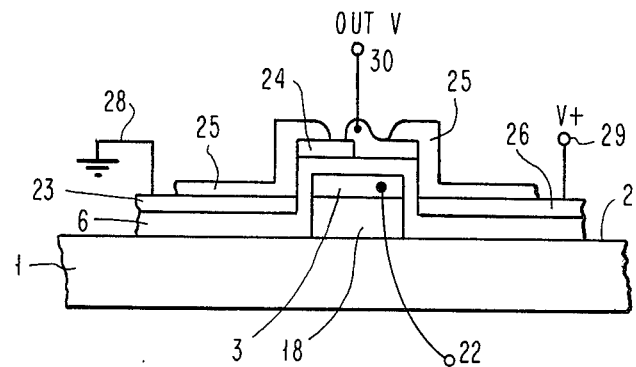

The separation of the contact area above the gate 3 and the external application of the semiconductor layer are illustrated in FIG. 7 where complementary n and p conductivity type devices are produced. In FIG. 7, again the same reference numerals are employed for the same elements in the figures. On the substrate 1 on surface 2 a gate 3 with terminal 22 is positioned. An insulating layer 6 is provided that is conformal over the gate 3 and on the surface 2 on each side.

A first n conductivity type transistor has as its source electrode 23 and as drain electrode 24. The metal employed for electrodes 23 and 24 is selected for good contact to n conductivity type semiconductor material.

The p conductivity type transistor has as source 26 and drain 24 electrodes a metal that provides a good electrical contact to p conductivity type semiconductor material.

The semiconductor material 25 is not intentionally doped and can be converted to either n or p conductivity through a field effect by a positive or negative signal, respectively, on the gate 3 terminal 22. Nominally undoped semiconductor films are generally referred to in the art as intrinsic. One skilled in the art will know how to dope the layers to provide alternative devices with enhancement or depletion modes of operation.

The resulting structure with the n conductivity type transistor source electrode 23 connected to reference potential through terminal 28 and the p conductivity type transistor source electrode 26 connected to +V potential through terminal 29, and with the output at 30, may serve as a logic inverter implemented by an interconnected complementary pair of transistors.

Referring next to FIG. 8, where again the same reference numerals are employed for like elements, a gate signal sensitive, continuous intrinsic semiconductor layer 31 and insulator layer 6 are conformally deposited over the prism made up of insulator 18 and gate 3, with separate deposition and erosion operations being employed for n conductivity type metal contacts 32 and 33 and for p conductivity type metal contacts 34 and 35. The structure when connected with terminal 28 connected to reference potential and terminal 29 to $+V$ potential, with a gate signal applied at terminal 22 and with the output at 30 is a complementary interconnected pair of self-aligned transistors that may be employed as a logic inverter.

BEST MODE FOR CARRYING OUT THE INVENTION

Figure 8:
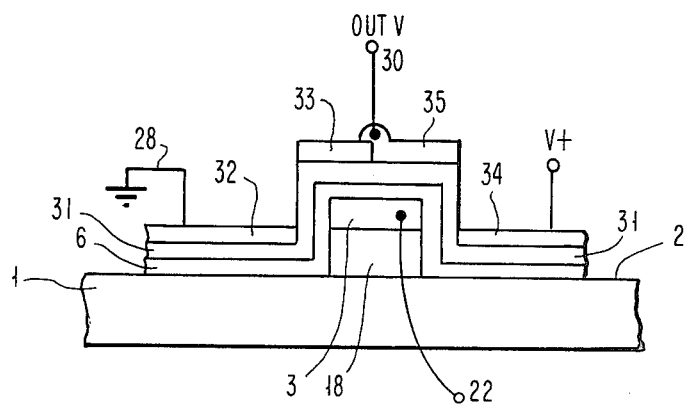

The preferred embodiment of the invention is that of the interconnected pair of complementary transistors, as illustrated in connection with FIG. 8.

The substrate 1 would be of supporting material that is generally insulating, for example, glass or silicon coated with oxide or nitride. The insulator 18 would be deposited. The gate 3 of conductive material such as molybdenum, chrome, nickel or nichrome, is deposited and lithographically patterned. The thickness of the order of 0.5 micrometers of the gate 3 will be selected in accordance with the desired length of the channel in the completed device. The essentially vertical sidewalls will be patterned by reactive ion etching of the gate 3 and spacing insulator 18 pedestal. The insulating layer 6 of, for example, $Si_3N_4$ or $SiO_2$ is deposited on the surface 2 and conformally over the insulator 18 and gate 3 combination.

The layer 31 is amorphous silicon with atomic hydrogen, known in the art as a-Si:H.

A lithographic mask is employed to define the a-Si:H layer 31 in the device area over the source, gate and drain electrodes. The conformal deposition of layer 31 may be by plasma deposition from silane gas, providing a nominally intrinsic semiconductor layer 31 that can be gate modulated to form either n-channel or p-channel.

A lithographically defined mask is employed to uncover the area for contacts 32 and 33. An evaporated metallization of MgAl or a TiAl bilayer which makes good n contact is produced by a vaporization direction with an incidence that is normal to the surface 2.

The contacts 32 and 33 are then separated by a dip etch to a depth sufficient to remove the metal on the vertical sidewalls.

A lithographically defined mask is then employed to cover contacts 32 and 33 and permit deposition of contacts 34 and 35 which are separated by a dip etch to remove the metal on the vertical sidewall. The metal chosen for contacts 34 and 35 is selected for good p contact, such as Au, Pt, Pd or other high work function metal.

In preserving self-alignment of gate 3 with respect to the contacts 32 and 34, the thickness of contacts 32 and 34 should approximately equal the difference in thickness between insulator 18 and the combined thickness of insulator 6 and semiconductor layer 31. Where self-alignment of the gate 3 with respect to the contacts 33 and 35 is desired, an additional insulating layer is added as illustrated in connection with FIG. 5 to reduce the parasitic capacitances between gate 3 and contacts 33 and 35.

A mask is then used to control an etching operation that exposes the source and drain electrodes to the contacts 32, 33, 34 and 35.

What has been described is a thin film transistor technology where a gate member on a substrate surface is in electric field influencing proximity to active semiconductor devices in the direction normal to the substrate surface and the ohmic electrodes of the active device are parallel with the substrate surface.

The principle of the invention provides alternate fabrication techniques.

The gate is formed on the substrate and conformal coatings of insulator and semiconductor are provided over it. A metal is deposited from the direction normal to the surface that is thicker in the horizontal dimension than the vertical so as to be susceptible to an erosion operation such as a dip etch which separates the metal into self-aligned contact areas on each side of a semiconductor device channel.

Alternatively, the gate is formed on a pedestal positioned on the substrate. The gate insulator is conformally coated over the combination of the gate and the pedestal. A non-conformal deposition of the source and drain electrodes is then made on the horizontal surfaces by directional evaporation followed by a dip etch without masking. An amorphous silicon semiconductor film is conformally deposited over the pedestal and gate combination with the source and drain electrodes in place. Contact through the amorphous silicon film are then lithographically defined to configure circuits as desired.

In an additional feature, gate capacitance can be further controlled through placing a spacer over the gate.

Having thus described our invention, what we claim as new and desire to secure by Letters Patent is:

1. A thin film semiconductor structure comprising:
   a substrate having a planar surface,
   a prism shaped gate electrode positioned on said planar surface, having a thickness dimension essentially perpendicular to said planar surface,
   a layer of hydrogenated amorphous semiconductor material portions of which are insulated from and parallel to said planar surface and another portion of which is insulated from and disposed conformally over said gate electrode,
   first metal electrodes forming an ohmic contacts to a portion of said layer of semiconductor material which is parallel to said planar surface and to said another portion which is disposed conformally over said gate,
   second metal electrodes of different metal from said first metal electrodes forming ohmic contacts to a portion different from said a portion of said layer of semiconductor material which is parallel to said planar surface and to said another portion which is disposed conformally over said gate, and
   channel portions in said layer of semiconductor material disposed between first metal electrodes and said second metal electrodes said channel portions being essentially parallel to said thickness dimension of said gate electrode.

2. A thin film structure according to claim 1 further including a prism shaped insulating layer interposed between said gate electrode and aid substrate having a second thickness.

3. A thin film structure according to claim 1 further including a separate member of insulating material the thickness of which decreases from the center thereof to its edges disposed atop said gate electrode, at least one of said first and second metal electrodes being disposed over said separation member and having a thickness which decreases from the center thereof to its edges and which terminates at an extremity of said at least one channel portion.

4. A thin film structure according to claim 2 wherein said channel portions have a length equal to said thickness of said gate electrode.

5. The structure of claim 1 where said semiconductor layer is insulated from said substrate and said gate by a separating insulating layer.

6. The structure of claim 5 wherein
said semiconductor material is of extrinsic conductivity type,
said first and second metal electrodes form ohmic contacts with said extrinsic semiductor, and
signal means for forming conducting channels in said channel portions connected to said gate.

7. The structure of claim 5 wherein
said semiconductor material is of intrinsic conductivity type,
said first and second metal electrodes form ohmic contacts with said intrinsic semiconductor, and
signal means for forming conducting channels in said channel portions connected to said gate.

* * * * *